United States Patent [19]
Overzet et al.

[11] Patent Number: 6,097,157
[45] Date of Patent: Aug. 1, 2000

[54] SYSTEM FOR ION ENERGY CONTROL DURING PLASMA PROCESSING

[75] Inventors: Lawrence J. Overzet; Brian A. Smith, both of Plano, Tex.

[73] Assignee: Board of Regents, The University of Texas System, Austin, Tex.

[21] Appl. No.: 09/057,892

[22] Filed: Apr. 9, 1998

Related U.S. Application Data

[60] Provisional application No. 60/043,782, Apr. 11, 1997.

[51] Int. Cl.[7] ........................................ H05H 1/00
[52] U.S. Cl. .................. 315/111.21; 315/111.51; 118/723 I
[58] Field of Search .......................... 315/111.31, 111.41, 315/111.21, 111.51, 111.71; 118/723 I

[56] References Cited

U.S. PATENT DOCUMENTS

| | | |
|---|---|---|
| 5,311,103 | 5/1994 | Asmussen et al. ................. 315/111.81 |
| 5,423,915 | 6/1995 | Breneman . |
| 5,435,886 | 7/1995 | Breneman . |
| 5,436,172 | 7/1995 | Breneman . |
| 5,453,305 | 9/1995 | Beck . |
| 5,467,013 | 11/1995 | Karlsen . |
| 5,472,561 | 12/1995 | Powell . |

*Primary Examiner*—David Vu
*Attorney, Agent, or Firm*—Daniel F. Perez; Edwin S. Flores; Gardere & Wynne, L.L.P.

[57] ABSTRACT

An apparatus and method for controlling the plasma potential of a plasma within a plasma chamber (50) is disclosed. The apparatus and method utilize a Faraday shielded inductive source antenna (60) to generate the plasma within the plasma chamber (50) and an electrically conductive probe (100) that is inserted into the plasma chamber (50) to regulate the plasma potential. By independent biasing of the conductive probe (100), which regulates the plasma potential, the ion energy distribution at a conductive substrate (150) within the plasma chamber (50) may be controlled.

20 Claims, 3 Drawing Sheets

SYSTEM FOR ION ENERGY CONTROL DURING PLASMA PROCESSING

This application claims benefit of Provisional Application Ser. No. 60/043,782 filed Apr. 11, 1997.

TECHNICAL FIELD OF THE INVENTION

The present invention relates in general to the field of plasma etching, and in particular, to an apparatus and method for controlling the plasma potential during the plasma-based etching of a chosen surface by means of a control probe located within a chamber.

BACKGROUND OF THE INVENTION

Without limiting the scope of the invention, its background is described in connection with the plasma etching of silicon wafer surfaces, as an example.

As MOS technology advances, increasingly thinner gate oxide layers are created, requiring greater control over the etching process. With thinner layers comes an increased demand for improved efficiency, decreased failure rates, and greater control over the process. One area that would greatly benefit from increased control of the processing of surfaces is the plasma etching process.

Heretofore, in this field, plasma etching has been accomplished with only generalized control over the ion energy flux and plasma potential. Using conventional inductively coupled plasma technology, a plasma is generated using antennas, or coils, that create radio-frequency (rf) electromagnetic fields within a vessel containing gas. To eliminate capacitive coupling of the coil to the plasma a Faraday shield is sometimes used, thereby eliminating most of the rf fluctuation of the plasma potential.

In present technology, most of the plasma reaction vessel or chamber is composed of metal tied to ground. These reactors hold the plasma potential of discharges formed within them at a value near ground, with some rf variation in plasma potential depending on the type of discharge source and the presence or absence of a Faraday shield. The bulk of the plasma is free of electric fields, except near the walls, where a sheath develops which contains the more mobile electrons. This sheath attracts positive ions to the surfaces in the chamber, including the surfaces to be processed.

In a silicon wafer etching process, the wafer is biased with a separate rf supply to give the surface of the wafer a dc bias potential with respect to the plasma potential to attract the ions to the wafer with greater energy. The plasma potential, however, may change during processing as the metallic walls of the chamber become deposited with etch products. Over time, plasma potential changes can shift ion energy distributions at the surface of some substrates affecting process control.

The plasma potential is established by the most positive potential in the chamber with which the plasma is in contact. As the portions of the wall that are made of dielectric material, or which have become deposited with dielectric material, are bombarded with positively charged particles, these portions of the wall charge up and change in potential. The influence of these charged surfaces on the plasma potential will depend on their surface area with respect to the grounded surfaces in the chamber and will change over time.

It is common practice to clean etching reactor chambers routinely to remove the build up of deposited material and restore the plasma both electrically and chemically to that of a new reactor. Thus, although the changes in plasma potential may stabilize after a certain time due to a complete coverage of the walls with deposited material, changes in the plasma potential will once again occur after the reactor has been cleaned and may cause considerable downtime or unproductive use of the reactor.

Therefore, a need has arisen for an apparatus that provides for the precise control of the plasma potential within a chamber and a method of controlling the plasma potential within the chamber, thereby increasing the control over the intrinsic characteristics of the plasma process.

SUMMARY OF THE INVENTION

In the present invention, an electrically conductive probe is inserted within a dielectric plasma chamber in order to regulate the electric potential of a plasma. In one embodiment of the present invention, an electrically insulating plasma reactor with a Faraday shielded inductive source antenna permits direct control of the dc plasma potential of the discharge. This control allows for a tailored ion energy distribution at a substrate of fixed potential or a fixed plasma potential at a chosen value. The chamber may be constructed from a non-conductive material such as Pyrex tubing. The present invention incorporates the use of the Faraday shielded inductive source coil and a small electrostatic probe in contact with the plasma to control the plasma potential.

By applying a waveform such as a stairstep potential to the probe of the present invention, an ion energy distribution of virtually any shape may be achieved. Using the insulated reactor of the present invention, ion production and ion energy may be controlled independently without the need for direct substrate biasing in the case of a conductive substrate. The insulated reactor also provides a way to maintain a consistent plasma potential within the chamber in situations where the chamber walls are easily contaminated by the process.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The apparatus and methods of the present invention allow for the control over the plasma potential in a reactor over extended periods of time in the context of a processing environment. This is often difficult to achieve in commercial semiconductor processing reactors because of the effects of oxidation and other contamination layers on chamber walls, especially those made of aluminum.

Figure 1:
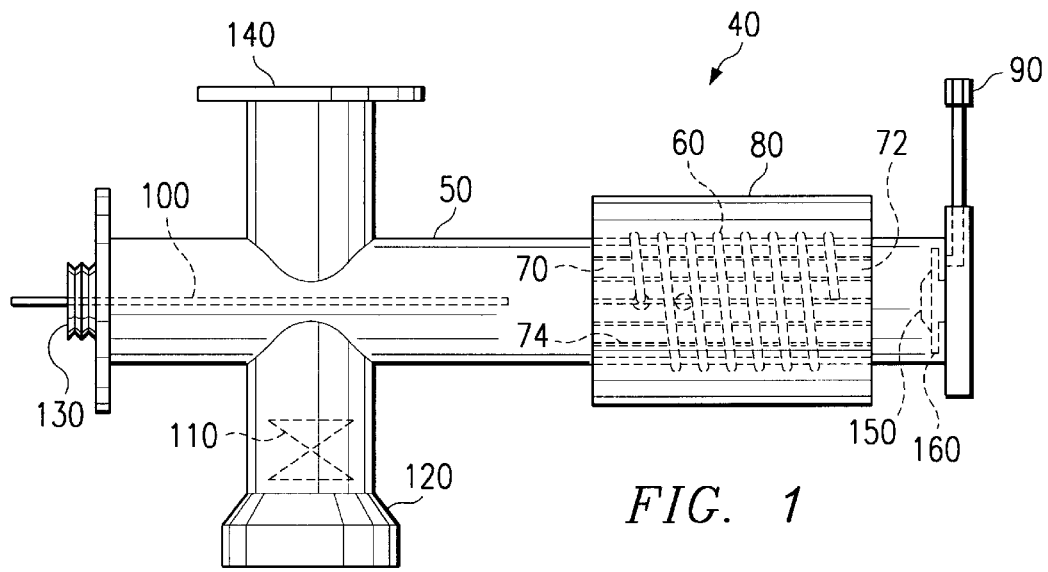
FIG. 1 is a cross sectional view of a plasma potential control reactor of the present invention with a helical resonator antenna.

The features of a plasma potential control reactor of the present invention are shown in FIG. 1 and are generally designated 40. The plasma reactor 40 has a dielectric or non-conductive plasma chamber 50. Examples of materials that may be used to make the plasma chamber 50 are non-conductive ceramics, such as alumina, glass or quartz. Surrounding the plasma chamber 50 is a radio-frequency ("rf") source coil 60.

Between the plasma chamber 50 and rf coil 60 is a Faraday shield 70. The Faraday shield 70 may be made using, for example, a copper cylinder 72 having axial slots 74 that is disposed axially along the length of the plasma chamber 50 in an area between the rf coil 60 and the plasma chamber 50. The slots 74 in the copper cylinder 72 may have, for example, a gap of approximately one-sixteenth of an inch. The distance between the copper cylinder 72 relative to the rf coil 60 and the plasma chamber 50, as well as the thickness of the copper cylinder 72 depend on the particular use and field that is generated by the rf coil 60, as will be known to those of skill in the art. A rf coil housing 80 may be placed surrounding the rf coil 60, and may be grounded for safety purposes.

A gas inlet 90 serves to feed gas into the plasma chamber 50. Examples of gases that may be used in the production of MOS devices include Argon, Oxygen, $CF_4$, HBr, and Chlorine. The particular gas used will depend on the material of the surface to be etched, e.g., polysilicon, aluminum or silicon dioxide, and is well known to those skilled in the art.

A vacuum is generated in the plasma chamber 50 by a vacuum pump 120. A vacuum can be drawn by a variety of vacuum systems depending on the level of internal pressure desired. Examples of vacuum pumps 120 that may be used include cryopumps, turbomolecular pumps, diffusion pumps and the like. Turbomolecular pumps are most commonly used because they permit fast cycling to and from atmospheric pressure and produce low contamination levels. The internal pressure of the plasma chamber 50 is measured using a pressure gauge 140, which may be a capacitance manometer. Internal pressure may be controlled using a feedback controlled throttle valve 110.

Plasma potential is controlled within the plasma chamber 50 using a probe 100. The probe 100 is made of metal wire inside a glass, ceramic, or quartz sleeve or sealed tube and is inserted through a bellows 130 on the plasma chamber 50.

Finally, an object such as a silicon wafer 150 is placed facing the interior of the plasma chamber 50 on a holding chuck 160. The surface of the object to be etched is in contact with the plasma within the plasma chamber 50.

Figure 2:
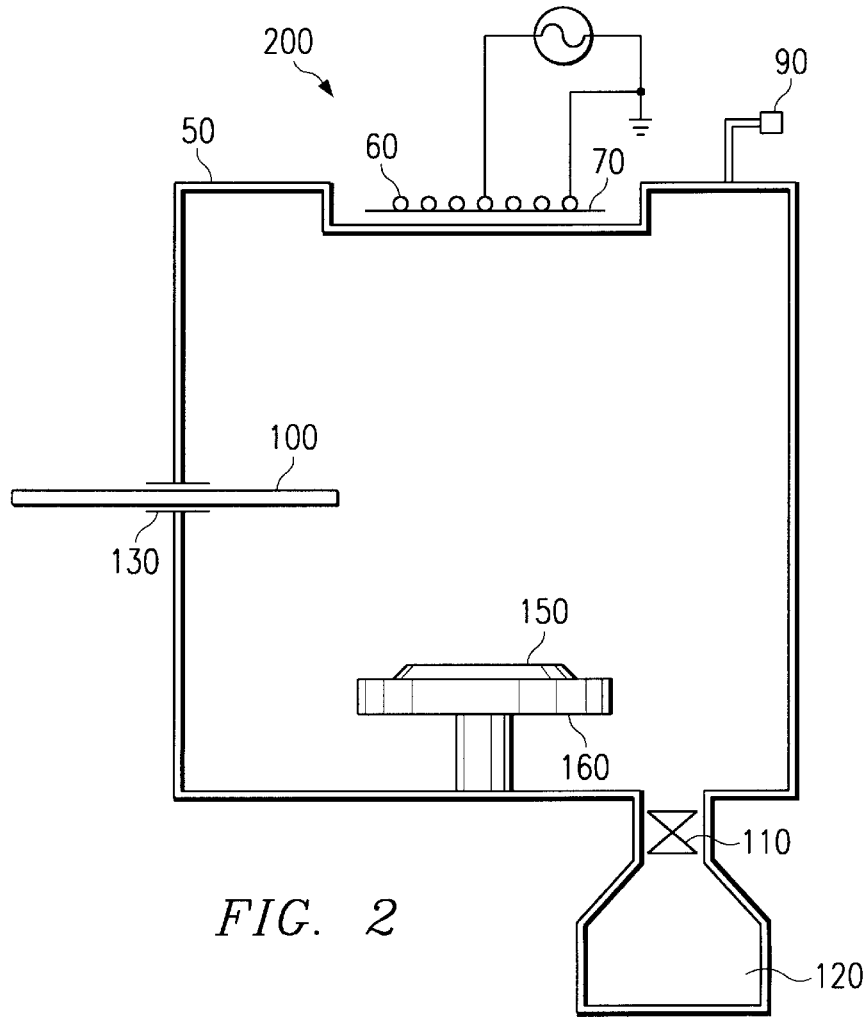
FIG. 2 is a cross sectional view of an alternative embodiment of the plasma potential control reactor of the present invention.
Figure 3A:
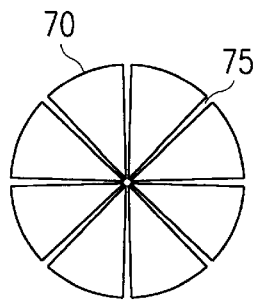
FIG. 3 shows the Faraday shield and the radio frequency source for use with the plasma potential control reactor of FIG. 2.
Figure 3B:
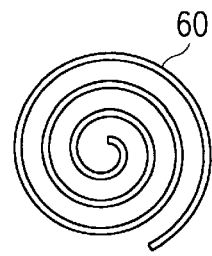

Turning now to FIGS. 2 and 3, an alternative embodiment of a plasma potential control reactor of the present invention is depicted and generally designated 200. At one end of plasma chamber 50 is an rf coil 60. Between the plasma chamber 50 and rf coil 60 is a Faraday shield 70. Faraday shield 70 is generally pie shaped as best seen in FIG. 3. The Faraday shield 70 may be constructed from for example, copper, and is generally disposed between the rf coil 60 and the plasma chamber 50. The spacing of the copper wedges 75 may vary and is determined by methods known to those of skill in the art.

A gas inlet 90 serves to feed gas into the plasma chamber 50. A vacuum is generated in the plasma chamber 50 by a vacuum pump 120 which may be a cryopump, a turbomolecular pump, a diffusion pump and the like. The internal pressure of the plasma chamber 50 is measured using a pressure gauge (not pictured) such as a capacitance manometer. Internal pressure may be controlled using a feedback controlled throttle valve 110.

Plasma potential is controlled within the plasma chamber 50 using a probe 100. The probe 100 is made of metal as described generally in the description of FIG. 1. The object, such as a silicon wafer 150, to be etched is placed facing the interior of the plasma chamber 50 on a holding chuck 160.

Figure 4:
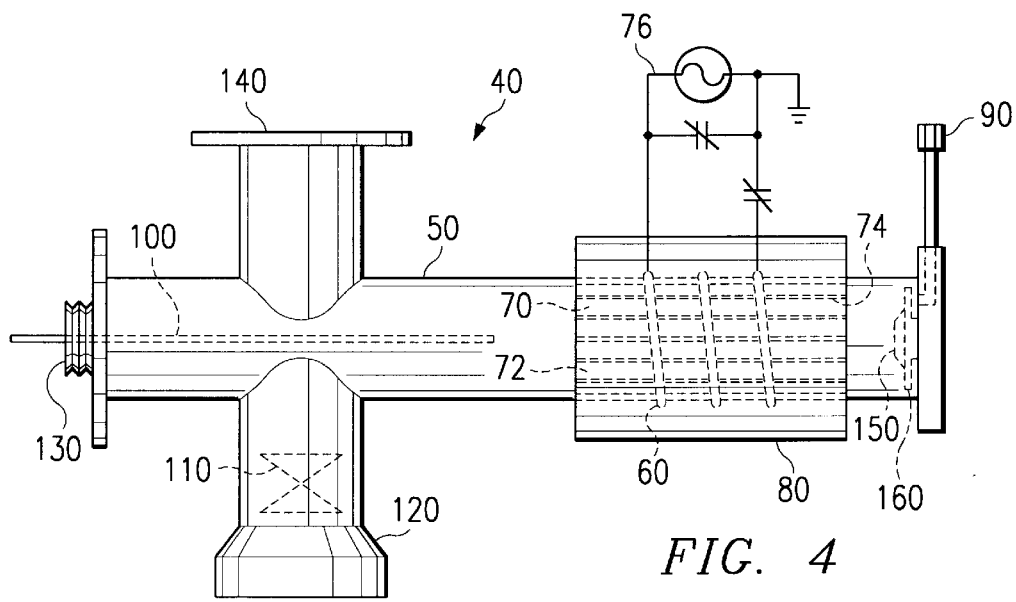
FIG. 4 is a cross sectional view of a plasma potential control reactor having a 3-turn non-resonant radio-frequency source.

The operation of the present invention is now described with reference to FIGS. 1 and 4. A rf coil 60, such as the helical resonator source antenna of FIG. 1 may be used to generate a plasma in a 11.4 cm diameter plasma chamber 50 made of, for example, Pyrex tubing. It should be noted by one skilled in the art that the resonant frequency of a helical resonator source antenna as depicted in FIG. 1 will vary with the density of the plasma within plasma chamber 50. Alternatively, as depicted in FIG. 4, a simple 3-turn non-resonant rf coil with a matching network 76, may be operated, for example, at a frequency of 13.56 MHZ. A Faraday shield 70, consisting of 0.16 cm wide slots 74 milled lengthwise into a copper cylinder 72, lies between the coil 60 and the plasma chamber 50. The Faraday shield 70 effectively blocks most of the radial and longitudinal components of the rf electric field between the rf coil 60 and the plasma. This type of Faraday shield 70 is commonly used on inductive discharges, and can reduce or eliminate the rf variation of the plasma potential. The plasma remains well confined within the plasma chamber 50 because there is little capacitive coupling to the source. A housing 80 surrounds the rf coil 60 and may serve to determine the resonant frequency of the rf coil 60.

Figure 5:
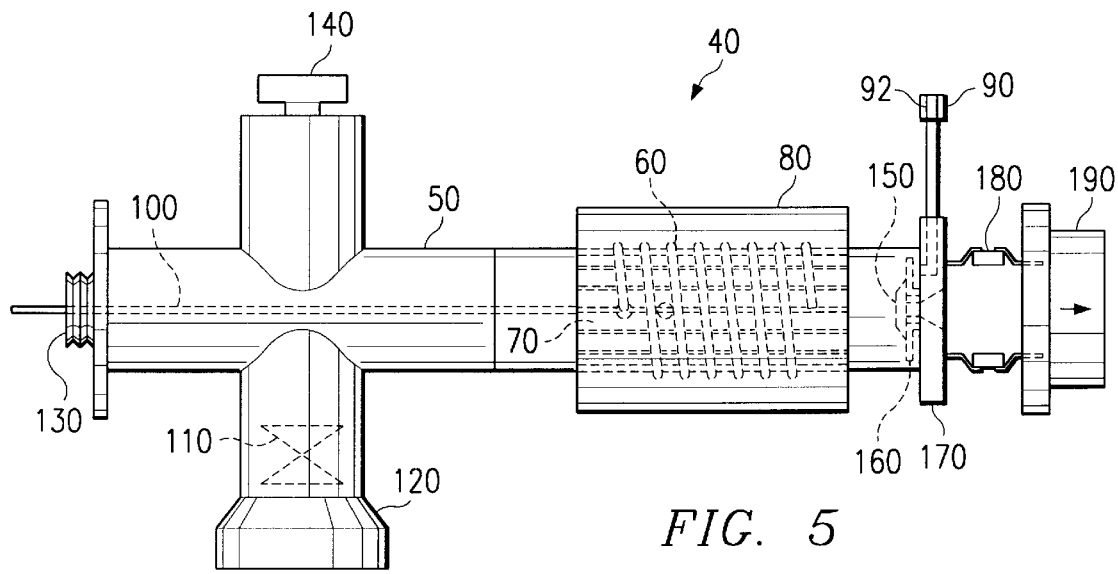
FIG. 5 is a cross sectional view of the plasma potential control reactor of FIG. 1 coupled with an apparatus for testing the plasma potential control mechanism of the present invention.

FIG. 5 depicts a plasma potential control reactor 40 of the present invention, coupled to a test apparatus. As with FIGS. 1, 2 and 4, FIG. 5 contains a plasma chamber 50, a rf generating coil 60, a Faraday shield 70 and a gas inlet 90. FIG. 5 also shows a circular stainless steel pinhole plate 170 with an area of 71 $cm^2$, having a pinhole of diameter 50 $\mu m$ and a pinhole thickness of 500 $\mu m$, which is located 15 cm from the edge of the coil 60 and permits ions to exit the glow discharge and enter a mass spectrometer/energy analyzer 190. The mass spectrometer/energy analyzer 190 measures the ion energy flux striking the pinhole plate 170. A ceramic flange 180 isolates the pinhole plate 170 from the ground potential of the mass spectrometer/energy analyzer 190. The energy analyzer component of the mass spectrometer/energy analyzer 190 is a Bessel box energy analyzer with better than 1 eV energy resolution for making ion energy distribution measurements. The energy distributions measured are with respect to ground, and the circular stainless steel pinhole plate 170 may be tied to ground. Turbomolecular pumps 120 evacuate the plasma chamber 50 and maintain the pressure in the mass spectrometer/energy analyzer 190 below $10^{-6}$ torr. Gas flow may be regulated by mass flow controllers 92. Gas may enter the plasma chamber 50 through a gas inlet 90. A pressure gauge 140 such as a capacitance manometer measures the pressure in the plasma chamber 50.

An electrostatic probe 100 is inserted into the plasma chamber 50 through a bellows 130 at the end of the plasma chamber 50 opposite the pinhole plate 170. In order to measure the electron temperature, while simultaneously biasing the plasma, a specially designed modified triple probe 100 may be used, consisting of a cylindrical nickel electrode for plasma potential control and two platinum wires of much smaller area to serve as a floating double probe. For example, a Kiethley 236 source/measure unit may serve to measure current-voltage characteristics with the triple probe 100. Other diagnostics on the system may include a microwave interferometer (not pictured) to measure the electron density outside the rf coils 60. Ion density measurements with probes may be compared with the interferometric density measurements to determine consistency and plasma uniformity.

The electron temperature, as obtained with the triple probe 100, is essentially independent of the plasma potential and input power, and depended almost entirely on pressure. The independence between electron temperature and power is shown in Table 1, which summarizes the electron temperature ($T_e$), the ion density ($n_p$) and electron densities ($n_e$) for various pressures and power levels in argon.

TABLE 1

Argon Plasma Electron Temperature and Densities with Estimated Uncertainties

| Pressure (mTorr) (±0.1) | Power (W) (±5) | $T_e$ (eV) (±0.5) | $n_p$ ($cm^{-3}$) ($\pm 4 \times 10^8$) | $n_e$ ($cm^{-3}$) ($\pm 3 \times 10^{10}$) |
|---|---|---|---|---|
| 5.0 | 83 | 2.5 | $4.0 \times 10^9$ | $5 \times 10^{10}$ |
| 5.0 | 300 | 2.5 | $2.0 \times 10^{10}$ | $6 \times 10^{10}$ |
| 12.0 | 218 | 2.1 | $1.0 \times 10^{10}$ | $5 \times 10^{10}$ |
| 20.0 | 84 | 1.6 | $4.0 \times 10^9$ | $9 \times 10^{10}$ |
| 20.0 | 351 | 1.9 | $3.0 \times 10^{10}$ | $1.0 \times 10^{11}$ |

The ion saturation current to the electrostatic probe varied by about a factor of two along the plasma chamber 50 axis from the axial center of the rf coils 60 to the region outside the rf coils 60 on the downstream side. For the reported ion densities, the electrostatic probe 100 was located outside the source region on the opposite side from the microwave interferometer to minimize rf interference from the rf coils 60. Thus, the measured densities differ due to measurement location. In addition, the microwave interferometer always measured a higher density than the probe 100, probably because the plasma was more intense near the rf power tap point. The circular stainless steel pinhole plate 170 was left to float and the electrostatic probe 100 was used to bias the plasma so that the floating potential was always 15 V above earth ground for the data in Table 1.

Figure 6:
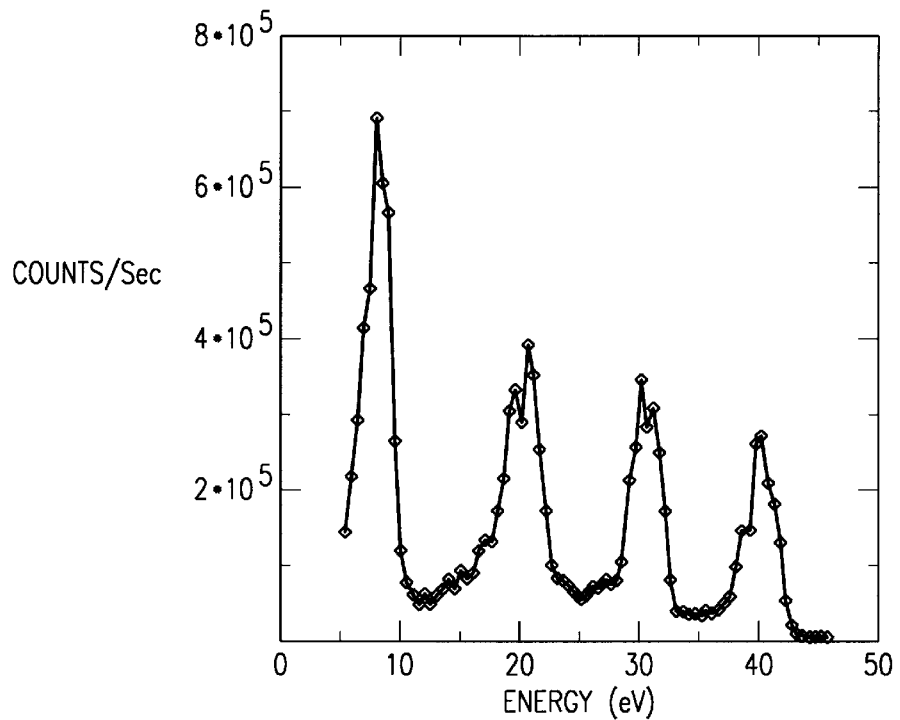
FIG. 6 is a graph showing the ion energy distribution of a pure argon discharge at 20 mTorr, 214 W, a current amplitude of 1.9 A, and a phase difference between voltage and current of 350 degrees.

FIG. 6 is an ion energy distribution (IED) of $Ar^+$ in a pure argon discharge in the helical resonator source of FIG. 1 at 20 mTorr and 214 W, with a current amplitude of 1.9 A, and phase difference between voltage and current of 350 degrees, indicative of resonant mode operation. The mass spectrometer 190 housing is tied to the circular stainless steel pinhole plate 170, with a ground wire bypassing the ceramic isolation 180 so that the measured IEDs correspond to the IED at the surface of the plate 170 as seen in FIG. 5. The four peaks correspond to a repetitive stairstep bias of 0, 20, 30, and 40 V on a single electrostatic probe 100 of area $5 \times 10^4$ $cm^2$. Each step in voltage occurs for 28.57 ms. The integration time used to obtain each point in the ion energy distribution is about 100 ms. A $T_e$ of 1.7 eV and density around $5 \times 10^{10}$ $cm^{-3}$ may be estimated from Table 1. The first peak in the IED, at about 7 eV, corresponds to the probe 100 biased at ground. This peak is the minimum energy peak possible with the pinhole plate 170 grounded, because the pinhole plate 170 becomes the controlling potential in the plasma chamber 50 when the electrostatic probe 100 potential drops lower than ground. The next three peaks in the IED line up in energy with the potential on the electrostatic probe 100, indicating that the plasma potential follows the potential of the electrostatic probe 100 closely as it is raised more positive than the potential of the circular stainless steel pinhole plate 170. The electrostatic probe 100 was positioned well within the center of the glow region where the ambipolar field is smallest. When an electrostatic probe 100 is placed outside the rf coil 60 region, the energy distribution shifts to as many as 10 eV higher than the potential of the probe 100 for similar pressures and power levels.

Figure 7:
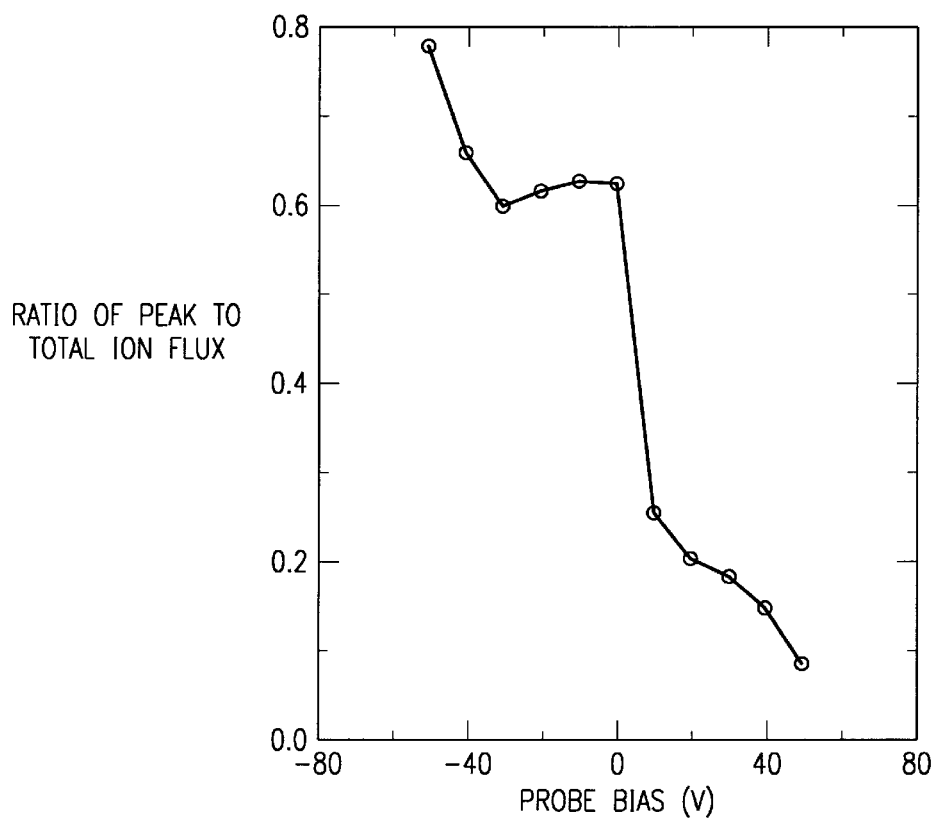
FIG. 7 is a graph showing the ratio of the ion flux at the energy peak versus the total ion flux.

One feature of the present invention is that, as the plasma is pushed to a higher and higher potential, the measured IED spreads out so that a smaller proportion of the total ion flux appears at the peak, and more and more appears in a low energy tail. The ratio of the ion flux appearing at the peak energy, where the plasma potential lies, to the total ion flux, is plotted in FIG. 7. The decrease in this ratio with plasma bias was due primarily to a widening of the sheath, which then became slightly more collisional. The Child law sheath width changes by approximately a factor of three with a change in plasma potential from 10 to 60 V, with typical widths in the range of 150 to 500 $\mu m$. A low-energy ion-neutral mean free path of about 1500 $\mu m$ was expected, so that a collisional sheath was being approached at the highest plasma bias values. The dwell time for different potential steps in the probe waveform may be adjusted if necessary to compensate for changes in IED peak height. The peaks can be made to increase in height with energy.

Similar results are obtained for positive ion species of $SF_6$ plasmas. The only differences in the IEDs for different gas chemistries appear to be changes in peak width due to the different types and frequencies of collisions in the sheath.

The present invention can be used to exert greater control over the plasma in an inductively coupled plasma reactor 40 using an independently biased probe 100 to control the plasma potential, and hence the ion energy to a surface held at a fixed potential in the plasma. This level of control is made possible by designing a reactor 40 to give the plasma very weak coupling to a reference potential, either from the resonant frequency power supply, through capacitive coupling to the resonant frequency coil 60, or from a ground reference at the walls of the plasma chamber 50. An electrostatic probe 100, carefully placed in the plasma chamber 50 to avoid contamination from the plasma, is used to control or stabilize the plasma potential against changes caused by chamber wall contamination. Using the apparatus and methods of the present invention almost any desired ion energy distribution can be produced at a conductive substrate surface with an area that is small compared to the walls of the plasma chamber 50 simply by applying an appropriate potential to such an electrostatic probe 100.

The apparatus and method of the present invention can be used in a wide variety of applications, such as more precise etching of metallic substrates and plasma surface preparation for conductive surfaces, as well as greater control over etch rates and deposited film properties. Using the present invention it may be possible to influence the energy flux to dielectric substrates with an rf bias on the probe, assuming the plasma potential is controllable at rf frequencies. Similar control may be exerted over the potential of a pulsed discharge during the afterglow.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus for ion energy control of a plasma comprising:

a chamber for containing said plasma;

a source for generating said plasma within the chamber; and an electrically conductive probe partially disposed within said chamber for regulating the plasma electric potential of the plasma within the chamber.

2. The apparatus of claim 1, wherein said chamber is further defined as comprising a dielectric material.

3. The apparatus of claim 2, wherein said dielectric material is selected from the group consisting of ceramics, alumina, glass and quartz.

4. The apparatus of claim 3, wherein said chamber is further defined as comprising Pyrex tubing.

5. The apparatus of claim 1, wherein said source further comprises an inductive source coil.

6. The apparatus of claim 1, wherein said electrically conductive probe, when biased, controls the ion energy at a processing surface adjacent to said plasma.

7. The apparatus of claim 1, further comprising a Faraday shield disposed between said source and said chamber.

8. The apparatus of claim 7, wherein said Faraday shield is generally pie shaped.

9. The apparatus of claim 7, wherein said Faraday shield is copper.

10. The apparatus of claim 1, wherein said source is a 3-turn non-resonant rf coil with a matching network.

11. The apparatus of claim 1, wherein said electrically conductive probe further comprises a nickel electrode and first and second platinum wires disposed adjacent to said nickel electrode and wherein said nickel electrode and said first and second platinum wires are electrically isolated from each other.

12. An apparatus for controlling the plasma electric potential of a plasma within a chamber comprising:

a source for generating said plasma within the chamber; and an electrically conductive probe partially disposed within said chamber for regulating the plasma electric potential of the plasma within the chamber.

13. The apparatus of claim 12, wherein said electrically conductive probe further comprises a nickel electrode and first and second platinum wires disposed adjacent to said nickel electrode and wherein said nickel electrode and said first and second platinum wires are electrically isolated from each other.

14. The apparatus of claim 12, wherein said electrically conductive probe, when biased, controls the ion energy at a processing surface adjacent to said plasma.

15. The apparatus of claim 12, further comprising a Faraday shield disposed between said source and said chamber.

16. The apparatus of claim 12, wherein said source further comprises an inductive source coil.

17. A method of controlling the plasma potential of a plasma within a chamber comprising the steps of:

generating a plasma within the chamber using a generating source;

providing a conductive probe, adapted to measure and control the plasma potential, said conductive probe at least partially disposed within the chamber and plasma;

measuring the plasma potential with the conductive probe; and independently biasing the conductive probe responsive to said measured plasma potential to control the plasma potential within the chamber.

18. The method of claim 17 wherein said probe further comprises a nickel electrode and a first and a second platinum wire disposed adjacent said nickel electrode, wherein said nickel electrode and said first and second platinum wires are electrically isolated from each other.

19. The method of claim 18, wherein said nickel electrode is further defined as cylindrical.

20. The method of claim 19, wherein said cylindrical nickel electrode is further defined as being hollow, and said first and second platinum wires are disposed within said hollow cylindrical nickel electrode.

\* \* \* \* \*